United States Patent
Ljungberg et al.

[11] Patent Number: 5,786,069
[45] Date of Patent: Jul. 28, 1998

[54] COATED TURNING INSERT

[75] Inventors: Bjorn Ljungberg, Enskede; Leif Åkesson, Älvsjö, both of Sweden

[73] Assignee: Sandvik AB, Sandviken, Sweden

[21] Appl. No.: 703,965

[22] Filed: Aug. 28, 1996

[51] Int. Cl.$^6$ .................. B32B 9/00; B32B 19/00
[52] U.S. Cl. .............. 428/216; 427/348; 427/376.2; 427/419.3; 51/307; 51/309; 407/119; 428/212; 428/457; 428/336; 428/796; 428/698; 428/699; 428/701; 428/702
[58] Field of Search ............ 51/307, 309; 407/119; 428/216, 336, 457, 697, 698, 699, 701, 702; 427/346, 376.2, 419.3

[56] References Cited

U.S. PATENT DOCUMENTS

| | | | |
|---|---|---|---|
| 4,180,400 | 12/1979 | Smith et al. | 428/469 |
| 4,610,931 | 9/1986 | Nemeth et al. | |
| 4,619,866 | 10/1986 | Smith et al. | 428/336 |
| 5,071,696 | 12/1991 | Chattfield et al. | 438/702 |
| 5,137,774 | 8/1992 | Ruppi | |
| 5,543,176 | 8/1996 | Mattfield et al. | 428/698 |
| 5,545,490 | 8/1996 | Oshika | 428/701 |
| 5,635,247 | 6/1997 | Ruppi | 427/348 |
| 5,652,045 | 7/1997 | Nakamura et al. | 428/216 |

FOREIGN PATENT DOCUMENTS

| | | |
|---|---|---|
| 0408535 A1 | 1/1991 | European Pat. Off. |
| 0594875 A1 | 5/1994 | European Pat. Off. |
| 0653499 A1 | 5/1995 | European Pat. Off. |
| 0685572 A2 | 12/1995 | European Pat. Off. |
| 0709484 A1 | 5/1996 | European Pat. Off. |
| 60-08008 | 1/1994 | Japan |
| 6-108254 | 4/1994 | Japan |
| 61-90605 | 7/1994 | Japan |
| 8201930-8 | 6/1989 | Sweden |

*Primary Examiner*—Archene Turner
*Attorney, Agent, or Firm*—Burns, Doane, Swecker & Mathis

[57] ABSTRACT

A coated turning insert particularly useful for turning of forged components of stainless steel low alloyed steel. The insert is characterized by a WC-Co cemented carbide body having a highly W-alloyed Co-binder phase and a coating including an innermost layer of $TiC_xN_yO_z$ with columnar grains and a top layer of fine grained $\kappa$-$Al_2O_3$.

28 Claims, 1 Drawing Sheet

COATED TURNING INSERT

CROSS-REFERENCE TO RELATED APPLICATIONS

The present application is related to commonly owned U.S. Pat. application Ser. Nos. 08/616,012; 08/675,034; 08/452,853 and 08/497,934.

1. Field of the Invention

The present invention relates to a coated cutting tool (cemented carbide insert) particularly useful for difficult cutting conditions such as turning of hot and cold forged low alloyed steel components like gear rings and axles used in the automotive industry and turning of stainless steel components like bars, tubes and flanges.

2. Background of the Invention

Stainless and low alloyed steels are materials which, in general, are difficult to machine with coated or uncoated cemented carbide tools. Smearing of workpiece material onto the cutting edge and flaking of the coating often occur. The cutting conditions are particularly difficult during the turning of forged low alloyed components under wet conditions (using coolant). The hot forged skin (0.05-0.2 mm) is generally decarburized and thus softer than the bulk material due to a mainly ferritic structure. The cold forged skin (less than 0.05 mm) is cold-worked and, thus, harder due to a deformation (strain hardening) effect. Furthermore, the ferrite/pearlite bulk structure of such a material is often "ferrite-striated," i.e., the ferrite and pearlite form parallel stripes. This mixture of hard and soft materials makes the cutting conditions very difficult.

Further, when turning stainless and low alloyed steels using coated cemented carbide tools, the cutting edge is worn by chemical wear, abrasive wear and by a so called adhesive wear. The adhesive wear is often the tool life limiting wear. Adhesive wear occurs when fragments or individual grains of the layers and later also parts of the cemented carbide are successively pulled away from the cutting edge as workpiece chips are formed. Further, when wet turning is employed, the wear may also be accelerated by an additional wear mechanism. Coolant and workpiece material may penetrate into the cooling cracks of the coatings. This penetration often leads to a chemical reaction between workpiece material and coolant with the cemented carbide. The Co-binder phase may oxidize in a zone near the crack and along the interface between the coating and the cemented carbide. After some time coating fragments are lost piece by piece.

Swedish Patent Application No. 9501286-0 (corresponding to U.S. Pat. application Ser. No. 08/616,012) discloses a coated cutting insert particularly useful for dry milling of grey cast iron. The insert is characterized by a straight WC-Co cemented carbide body and a coating including a layer of $TiC_xN_yO_z$ with columnar grains and a top layer of fine grained $\alpha\text{-}Al_2O_3$.

Swedish Patent Application No. 9502640-7 (corresponding to U.S. Pat. application Ser. No. 08/675,034) discloses a coated turning insert particularly useful for intermittent turning of low alloyed steel. The insert is characterized by a WC-Co cemented carbide body having a highly W-alloyed Co-binder phase and a coating including a layer of $TiC_xN_yO_z$ with columnar grains and a top layer of fine grained, textured $\alpha\text{-}Al_2O_3$.

In view of the state of the art, there is a need for a cutting insert for machining low alloyed steel and stainless steel components, especially a coated cutting insert which exhibits improved wear, reduced flaking of the coating, and/or improved resistance to chemical attack.

SUMMARY OF THE INVENTION

An object of the invention is to avoid or alleviate problems associated with prior art cutting inserts.

According to one aspect of the invention, a cutting tool insert for turning of steel comprises a cemented carbide body having a coating thereon, the cemented carbide body including WC, 5–11 wt % Co and 2–10 wt % cubic carbides of groups IVb, Vb and/or VIb of the periodic table and a highly W-alloyed binder phase with a CW-ratio of 0.76–0.92. The coating comprises a first layer of $TiC_xN_yO_z$ having a thickness of 0.1–2 μm and equiaxed grains <0.5 μm in size, a second layer of $TiC_xN_yO_z$ having a thickness of 3–15 μm and columnar grains <5 μm in diameter, and a third layer of a smooth, fine-grained $\kappa\text{-}Al_2O_3$-layer having a thickness of 1–9 μm.

According to another aspect of the invention, a method of coating an insert is provided wherein a turning insert comprising a cemented carbide body including WC, 5–11 wt % Co and 2–10 wt % cubic carbides of groups IVb, Vb and/or VIb of the periodic table and a highly W-alloyed binder phase with a CW-ratio of 0.76–0.92 is coated by coating the cemented carbide body with a first layer of $TiC_xN_yO_z$ having a thickness of 0.1–2 μm and equiaxed grains <0.5 μm in size by chemical vapor deposition, coating the first layer with a second layer of $TiC_xN_yO_z$ having a thickness of 3–15 μm and columnar grains <5 μm in diameter by chemical vapor deposition at a temperature of 700° to 900° C. while using acetonitrile as a source of carbon and nitrogen for the second layer, and coating the second layer with a third layer of a smooth, fine-grained $\kappa\text{-}Al_2O_3$-layer having a thickness of 1–9 μm.

The invention also provides a method of machining a workpiece with the coated cutting insert. In the method, a workpiece is machined with a turning insert comprising a cemented carbide body having a coating thereon, the cemented carbide body including WC, 5–11 wt % Co and 2–10 wt % cubic carbides of groups IVb, Vb and/or VIb of the periodic table and a highly W-alloyed binder phase with a CW-ratio of 0.76–0.92, the coating including a first layer of $TiC_xN_yO_z$ having a thickness of 0.1–2 μm and equiaxed grains <0.5 μm in size, a second layer of $TiC_xN_yO_z$ having a thickness of 3–15 μm and columnar grains <5 μm in diameter, and a third layer of smooth, fine-grained $\kappa\text{-}Al_2O_3$ having a thickness of 1–9 μm, the method comprising contacting the workpiece with a cutting edge of the insert, moving the insert relative to the workpiece and cutting material from the workpiece in contact with the cutting edge.

DETAILED DESCRIPTION OF THE PREFERRED EMBODIMENTS

Figure 1:
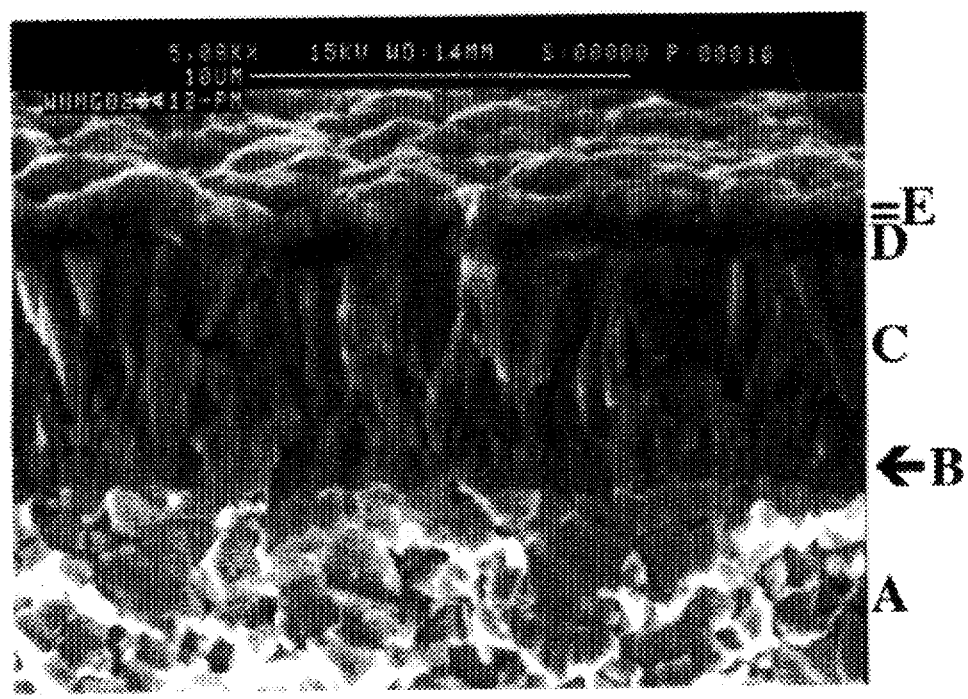
FIG. 1 is a photomicrograph at 5000× magnification of a coated insert according to the present invention in which A represents a cemented carbide body, B represents a $TiC_xN_yO_z$-layer with equiaxed grains, C represents a $TiC_xN_yO_z$-layer with columnar grains, D represents a $\kappa\text{-}Al_2O_3$-layer with columnar like grains, and E represents an optional TiN-layer.

The invention provides an improvement in coated turning inserts especially useful for difficult cutting conditions involving turning of forged low alloyed steel components and stainless steel components. Compared to the coated turning inserts disclosed in U.S. Pat. application Ser. No. 08/675,034, it has surprisingly been found that by replacing the textured $\alpha$-Al$_2$O$_3$-layer of such turning inserts with a $\kappa$-Al$_2$O$_3$-layer, the coated turning insert according to the invention advantageously provides an improved cutting tool with excellent properties for turning of stainless steel and forged components of low alloyed steel.

According to one embodiment of the invention, a turning tool insert is provided with a cemented carbide body including 5–11, preferably 5–8, most preferably 6.5–8, wt % Co, 2–10, preferably 4–7.5, most preferably 5–7, wt % cubic carbides of metals from groups IVb, Vb or VIb of the periodic table of elements which preferably are Ti, Ta and/or Nb and balance WC. The grain size of the WC is about 2 μm. The cobalt binder phase is highly alloyed with W. The content of W in the binder phase can be expressed as the CW-ratio $=M_s/(wt\% Co)\times(0.0161)$, where $M_s$ is the measured saturation magnetization of the cemented carbide body in kA/m and wt % Co is the weight percentage of Co in the cemented carbide. The CW-ratio is a function of the W content in the Co binder phase. A low CW-ratio corresponds to a high W-content in the binder phase.

It has now been found according to the invention that improved cutting performance is achieved if the cemented carbide body has a CW-ratio of 0.76–0.92, preferably 0.80–0.90. The cemented carbide body may contain small amounts, <1 volume %, of $\eta$-phase (M$_6$C), without any detrimental effect. In a preferred embodiment, a surface zone about 15 to 35 μm thick depleted of cubic carbides and often enriched (generally more than 25% enrichment) in binder phase can be present according to prior art such as disclosed in U.S. Pat. No. 4,610,931. In this case, the cemented carbide may contain carbonitride or even nitride.

The coating preferably comprises the following layers:

A first (innermost) layer of TiC$_x$N$_y$O$_z$ with x+y+z=1, preferably z<0.5, with a thickness of 0.1–2 μm and with equiaxed grains with size <0.5 μm.

A second (intermediate) layer of TiC$_x$N$_y$O$_z$ with x+y+z=1, preferably with z=0 and x>0.3 and y>0.3, with a thickness of 3–15 μm, preferably 5–8 μm, with columnar grains and with an average grain diameter of <5 μm, preferably <2 μm. In an alternative embodiment, the outer part of this layer may contain oxygen, z<0.5.

A third layer of a smooth, fine-grained (grain size 0.5–2 μm) Al$_2$O$_3$ consisting essentially of the $\kappa$-phase. However, this layer may contain small amounts, e.g., 1–3 volume %, of the $\theta$- or the $\alpha$-phases as determined by XRD-measurement. The Al$_2$O$_3$-layer can have a thickness of 1–9 μm, preferably 1–3 μm or alternatively 4–8 μm and a surface roughness $R_{max}\leq 0.4$ μm over a length of 10 μm. Preferably, this Al$_2$O$_3$-layer is the outermost layer but it may also be followed by further layers such as thin (about 0.1–1 μm) decorative layer of, e.g., TiN.

According to a method of the invention, a WC-Co-based cemented carbide body having a highly W-alloyed binder phase with a CW-ratio of 0.76–0.92, preferably 0.80–0.90, and preferably with a binder phase enriched surface zone is coated with the following layers:

A first (innermost) layer of TiC$_x$N$_y$O$_z$ with x+y+z=1, preferably z<0.5, with a thickness of 0.1–2 μm and with equiaxed grains with size <0.5 μm using known CVD-methods.

A second layer of TiC$_x$N$_y$O$_z$ with x+y+z=1, preferably with z=0 or alternatively z<0.5 and x>0.3 and y>0.3, with a thickness of 3–15 μm, preferably 5–8 μm, with columnar grains and with an average grain diameter of <5 μm, preferably <2 μm, using preferably MTCVD-technique (using acetonitrile as the carbon and nitrogen source for forming the layer in the temperature range of 700–900° C.). The exact conditions, however, depend to a certain extent on the design of the equipment used.

A third (outer) layer of a smooth Al$_2$O$_3$-layer essentially consisting of $\kappa$-Al$_2$O$_3$ is deposited under conditions disclosed in EP-A-523021 (corresponding to U.S. Pat. application Ser. No. 08/452,853). The Al$_2$O$_3$-layer has a thickness of 1–9 μm, preferably 1–3 μm or alternatively 4–8 μm and a surface roughness $R_{max}<0.4$ μm over a length of 10 μm. The smooth coating surface can be obtained by a gentle wet-blasting the coating surface with fine grained (400–150 mesh) alumina powder or by brushing the edges with brushes based on, e.g., SiC as disclosed in Swedish Patent Application No. 9402543-4 (corresponding to U.S. Pat. application Ser. No. 08/497,934).

The invention is additionally illustrated in connection with the following Examples which are to be considered as illustrative of the present invention. It should be understood, however, that the invention is not limited to the specific details of the Examples.

EXAMPLE 1

Insert A: Cemented carbide turning tool inserts of style CNMG 120408-PM with the composition 7.5 wt % Co, 1.8 wt % TiC, 0.5 wt % TiN, 3.0 wt % TaC, 0.4 wt % NbC and balance WC, with a binder phase highly alloyed with W corresponding to a CW-ratio of 0.88 were coated with a 0.5 μm equiaxed TiCN-layer (with a high nitrogen content corresponding to an estimated C/N-ratio of 0.05) followed by a 7 μm thick TiCN-layer with columnar grains by using MTCVD-technique (temperature 885–850° C. and CH$_3$CN as the carbon/nitrogen source). In subsequent steps during the same coating cycle, a 1.5 μm thick layer of Al$_2$O$_3$ was deposited using a temperature 970° C and a concentration of H$_2$S dopant of 0.4% as disclosed in EP-A-523021 (corresponding to U.S. Pat. application Ser. No. 08/452, 853). A thin (0.5 μm) decorative layer of TiN was deposited on top according to known CVD-technique. XRD-measurement showed that the Al$_2$O$_3$-layer consisted of 100% $\kappa$-phase. The cemented carbide body had a surface zone about 25 μm thick, depleted from cubic carbides and with about 30% enrichment in binder phase. The coated inserts were brushed by a nylon straw brush containing SiC grains. Examination of the brushed inserts in a light microscope showed that the thin TiN-layer had been brushed away only along the cutting edge leaving there a smooth Rmax= 0.3/μm Al$_2$O$_3$-layer surface. Coating thickness measurements on cross-sectioned brushed samples showed no reduction of the coating along the edge line except for the outer TiN-layer that was removed.

Insert B: A commercially available cemented carbide grade in style CNMG 120408 from a leading carbide producer was selected for comparison in a turning test. The carbide had a composition of 9.8 wt % Co, 0.2 wt % TiC, 2.0 wt % TaC, balance WC and a CW-ratio of 0.86. The insert had a coating consisting of a 5 μm thick TiCN-layer followed by a 1.5 μm thick Al$_2$O$_3$-layer and a 0.5 μm TiN-layer. Light microscope examination showed that the insert had not been smoothed along the edgeline after the coating step.

Inserts A and B were compared in a turning test of a hot forged ring gear (diameter 206 mm, in TSCM 815H material). Each turning cycle performed on each component consisted of one facing cut, one longitudinal cut and one chamfering cut. The feed was 0.35 mm/rev and cutting speed around 230 m/min.

First, 150 components were machined with inserts A and B and obtained flank wear was measured and compared. Since the wear was much less developed on insert A it was allowed to cut further components, altogether 354 components. Obtained flank wear is shown in Table 1:

TABLE 1

|  | Number of components | measured flank wear, mm |
| --- | --- | --- |
| insert A (according to the invention) | 150 | 0.07 |
| insert A (according to the invention) | 354 | 0.08 |
| insert B (comparative) | 150 | 0.10 |

Microscope examination of the tested inserts showed tiny flaking on insert B while no visible flaking had occurred on insert A, not even after machining 354 components.

It is obvious from the obtained flank wear that insert A according to the invention is superior and possesses longer tool life than insert B.

EXAMPLE 2

Insert D: A commercially available cemented carbide grade in style CNMG 120408 from another leading carbide producer was selected for comparison in a turning test. The chemical composition of the cemented carbide was: 7.6 wt % Co, 2.4 wt % TiC, 0.5 wt % TiN, 2.4 wt % TaC, 0.3 wt % NbC and balance WC. The cemented carbide had a surface zone, about 20 µm thick, depleted from cubic carbides. The composition of the cemented carbide was similar to that of insert A but had a higher CW-ratio of 0.93 and a different coating which consisted of a 5 µm TiCN-layer followed by a 3.5 µm TiC-layer, a 1.5 µm $Al_2O_3$-layer and a 0.5 µm TiN-layer. Light microscope examination showed that the insert had not been smoothed along the edgeline after the coating step.

Inserts A and D were compared in a facing turning test in a hot forged ring gear (outer diameter of 180 mm and inner diameter of 98 mm in a SCr420H material) with feed =0.25–0.35 mm/rev and cutting speed around 220 m/min. The inserts were run to a predetermined flank wear value of 0.08 mm and the number of produced components was the evaluation criteria as set forth in Table 2.

TABLE 2

|  | Number of components | measured flank wear, mm |
| --- | --- | --- |
| insert A edge 1 (according to the invention) | 203 | 0.08 mm |
| insert A edge 2 (according to the invention) | 226 | 0.08 mm |
| insert D (comparative) | 182 | 0.08 mm |

EXAMPLE 3

Insert C: Cemented carbide turning tool inserts of style WNMG 080408-PM with the same composition and CW-ratio of 0.88 as insert A were coated according to the same technique used to prepare insert A. XRD-measurement showed that the $Al_2O_3$-layer consisted of 100% κ-phase. The inserts were brushed according to the same technique used to prepare insert A.

Insert E: An insert in style WNMG 080408 from the same cemented carbide producer as insert D and with the same CW-ratio, carbide composition and coating as insert D was selected for comparison in a turning test. Light microscope examination showed that the insert had not been smoothed along the edgeline after the coating step.

Inserts C and E were compared in a facing turning test of a forged axle (length of 487 mm and a diameter of 27–65 mm, material 50CV4) with feed of 0.28–0.30 mm/rev and cutting speed around 160 m/min. Three axles were run per each cutting edge and the wear of the cutting edges was examined in a light microscope as set forth in Table 3.

TABLE 3

| insert C (according to the invention) | flank wear less than 0.07 mm no flaking |
| --- | --- |
| insert B (comparative) | flank wear less than 0.07 mm flaking and chipping along the edge |

EXAMPLE 4

Insert F: Cemented carbide turning tool inserts of style CNMG 120408-PM from the same batch as insert A were coated according to Swedish Patent Application No. 9502640-7 (corresponding to U.S. Pat. application Ser. No. 08/675,034) with 0.5 thick equiaxed TiCN-layer followed by a 7 µm thick TiCN-layer with columnar grains, 1 µm thick equiaxed TiCN-layer and a 4 µm thick 012-textured α-$Al_2O_3$-layer. The inserts were wet-blasted using a water/$Al_2O_3$-slurry in order to smooth the coating surfaces.

Insert G: Cemented carbide turning tool inserts of style CNMG 120408-PM with the composition 6.5 wt % Co and 8.8 wt % cubic carbides (3.3 wt % TiC, 3.4 wt % TaC and 2.1 wt % NbC) and balance WC were coated by the same technique used to prepare insert A. The cemented carbide body had a CW-ratio of 1.0 and a surface zone about 23 µm thick depleted of cubic carbides and enriched in binder phase. XRD-measurement showed that the $Al_2O_3$-layer consisted only of the κ-phase.

Inserts A, F, G and B were compared in a turning test of a hot and cold forged ring gear of SCr420H material.

The ring gear had an outer diameter of 190 mm and an inner diameter of 98 mm. Each turning cycle performed on each component consisted of three facing cuts and one longitudinal cut. Feed was 0.25–0.40 mm/rev and cutting speed around 200 m/min. 170 components were machined and the wear of the cutting edges was examined as set forth in Table 4.

TABLE 4

| insert A (according to the invention) | no visible flaking of the coating, flank wear less than 0.07 mm |
| --- | --- |
| insert F (CW-ratio = 0.88) | some removal of the coating along the cutting edge, flank wear less than 0.08 mm |
| insert G (CW-ratio = 1.0) | substantial flaking along the cutting edge and flack wear more than 0.10 mm |
| insert B (comparative) | some removal of coating along the cutting edge, flank wear less than 0.08 mm |

Although insert F produced according to the Swedish patent application 9502640-7 (corresponding to U.S. Pat. application Ser. No. 08/675,034) generally performs well when turning low alloyed steels it can not always compete with insert A produced according to the present invention when turning some hot and cold forged low alloyed steel components.

EXAMPLE 5

Insert H: Inserts from the same batch as insert A were coated according to the same technique used to prepare insert A with the exception that the process time for the $Al_2O_3$ coating step was prolonged to 7.5 hours giving a 5.5 μm thick layer of $Al_2O_3$. A thin (0.5 μm) decorative layer of TiN was deposited on top using a prior art technique.

Insert I: Inserts of the type used to prepare insert H were coated with a 7 μm equiaxed layer of TiCN followed by a 5 μm thick layer of $Al_2O_3$-layer and a 0.5 μm top coating of TiN using a prior art technique. XRD-analysis showed that the $Al_2O_3$-layer consisted of a mixture of α- and κ-$Al_2O_3$, approximately in the ratio 30/70. Inserts H and A were brushed after coating in order to remove the TiN-layer and smooth the cutting edge.

Inserts H, A and I were tested in an intermittent longitudinal turning operation. The workpiece material was a low alloyed low carbon steel (SCr420H) in the shape of a 22 mm thick ring with an outer diameter of 190 mm and an inner diameter of 30 mm. Each longitudinal passage over the ring thickness consisted of 22 in-cuts of 1 mm each. The number of passages over the ring thickness until flaking occurred was recorded for each insert as set forth in Table 5.

TABLE 5

| Insert | number of passages before edge flaking |
| --- | --- |
| A (invention) 1.5 μm $Al_2O_3$ | 240 |
| H (invention) 5.5 μm $Al_2O_3$ | 180 |
| I (comparative) 5 μm $Al_2O_3$ | 40 |

Inserts H and A were also compared in a cutting test in a ball-bearing steel (SKF25B, v=250 m/min. f=0.3 mm/r, depth of cut=2 mm). In this test crater wear was predominant. The inserts were run for 15 min. and the formed crater wear was measured as crater area in MM2 as set forth in Table 6.

TABLE 6

| Insert | crater area |
| --- | --- |
| A (invention) 1.5 μm $Al_2O_3$ | 0.9 mm$^2$ |
| H (invention) 5.5 μm $Al_2O_3$ | 0.5 mm$^2$ |

From the test results above it is clear that the insert I has inferior flaking resistance compared to inserts H and A. Insert H showed good results with respect to crater wear resistance and flaking resistance. Insert A showed the best flaking resistance and can be used in cutting operations demanding extremely high flaking resistance.

EXAMPLE 6

Insert J: Insert J was prepared from a cemented carbide turning tool insert in style TNMG 160408-MM with the composition of 7.5 wt % Co, 1.8 wt % TiC, 3.0 wt % TaC, 0.4 wt % NbC, balance WC and a CW-ratio of 0.88. The cemented carbide had a surface zone about 25 μm thick, depleted from cubic carbides. The insert was coated with an innermost 0.5 μm equiaxed TiCN-layer with a high nitrogen content, corresponding to an estimated C/N ratio of 0.05, followed by a 7.2 μm thick layer of columnar TiCN deposited using MT-CVD technique. In subsequent steps during the same coating process, a 1.2 μm layer of $Al_2O_3$ consisting of pure κ-phase according to procedure disclosed in EP-A-523021 (corresponding to U.S. Pat. application Ser. No. 08/452,853) was deposited on the insert. A thin, 0.5 μm, TiN layer was deposited, during the same cycle, on top of the $Al_2O_3$-layer. The coated insert was brushed by a SiC containing nylon straw brush after coating, removing the outer TiN layer on the edge.

Insert K: A commercially available cemented carbide turning tool insert in style TNMG 160408 from a leading cemented carbide producer was selected for comparison in a turning test. The carbide had a composition of 9.0 wt % Co, 0.2 wt % TiC, 1.7 wt % TaC, 0.2 wt % NbC, balance WC and a CW-ratio of 0.90. The insert had a coating consisting of 1.0 μm thick TiC-layer, 0.8 μm thick TiN-layer, 1.0 μm thick TiC-layer and outermost 0.8 μm thick TiN-layer. Examination in light optical microscope revealed no edge treatment subsequent to coating.

The inserts J and K were tested in longitudinal, dry, turning of a shaft of duplex stainless steel with a feed of 0.3 mm/rev., speed of 140 m/min and depth of cut of 2 mm. Total cutting time per component was 12 minutes.

Insert K suffered plastic deformation whereas insert J suffered some notch wear.

One edge of insert J according to the invention completed one component whereas four edges were required to finalize one component using comparative insert K.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A cutting tool insert for turning of steel comprising a cemented carbide body and a coating thereon, the cemented carbide body including WC, 5–11 wt % Co and 2–10 wt % cubic carbides of groups IVb, Vb and/or VIb of the periodic table and a highly W-alloyed binder phase with a CW-ratio of 0.76–0.92, the coating comprising:

a first layer of $TiC_xN_yO_z$ having a thickness of 0.1–2 μm and equiaxed grains <0.5 μm in size;

a second layer of $TiC_xN_yO_z$ having a thickness of 3–15 μm and columnar grains <5 μm in diameter; and a third layer of a smooth, fine-grained κ-$Al_2O_3$-layer having a thickness of 1–9 μm.

2. The cutting insert according to claim 1, wherein the κ-$Al_2O_3$-layer has a thickness of 1–3 μm.

3. The cutting insert according to claim 1, wherein the κ-$Al_2O_3$-layer has a thickness of 4–8 μm.

4. The cutting insert according to claim 1, wherein the cemented carbide body has a surface zone depleted of cubic carbides.

5. The cutting insert according to claim 1, wherein the cemented carbide body includes 6.5–8.0 wt % Co and has a CW-ratio of 0.80–0.90.

6. The cutting insert according to claim 1, further comprising a fourth layer of TiN.

7. The cutting insert according to claim 6, wherein the TiN-layer does not cover a cutting edge of the insert.

8. The cutting insert according to claim 1, wherein the first layer is in contact with the cemented carbide body and the second layer is in contact with the first layer and the third layer, the third layer having a grain size of 0.5 to 2 μm.

9. The cutting insert according to claim 1, wherein x+y+z=1 with z<0.5 in the first layer and x+y+z=1 with x>0.3 and y>0.3 in the second layer.

10. The cutting insert according to claim 6, wherein the fourth layer is in contact with the third layer and the fourth layer has a thickness of 0.1 to 1 µm.

11. The cutting insert according to claim 4, wherein the surface zone has a thickness of 15 to 35 µm and the cubic carbides include TiC, TaC and/or NbC.

12. A method of coating a turning insert comprising a cemented carbide body including WC, 5–11 wt % Co and 2–10 wt % cubic carbides of groups IVb, Vb and/or VIb of the periodic table and a highly W-alloyed binder phase with a CW-ratio of 0.76–0.92, the method comprising:

coating the cemented carbide body with a first layer of $TiC_xN_yO_z$ having a thickness of 0.1–2 µm and equiaxed grains <0.5 µm in size by chemical vapor deposition;

coating the first layer with a second layer of $TiC_xN_yO_z$ having a thickness of 3–15 µm and columnar grains <5 µm in diameter by chemical vapor deposition at a temperature of 700° to 900° C. while using acetonitrile as a source of carbon and nitrogen for the second layer; and coating the second layer with a third layer of a smooth, fine-grained $\kappa$-$Al_2O_3$-layer having a thickness of 1–9 µm.

13. The method of claim 12, wherein the $\kappa$-$Al_2O_3$-layer is deposited in a thickness of 1–3 µm.

14. The method of claim 12, wherein the $\kappa$-$Al_2O_3$-layer is deposited in a thickness of 4–8 µm.

15. The method of claim 12, wherein the cemented carbide body has a surface zone depleted from cubic carbides and the cubic carbides include TiC, TaC and/or NbC.

16. The method of claim 12, wherein the cemented carbide body includes 6.5–8.0 wt % Co and has a CW-ratio of 0.80–0.90.

17. The method of claim 12, further comprising depositing a fourth layer of TiN on the third layer.

18. The method of claim 17, further comprising removing the TiN-layer on a cutting edge of the insert.

19. The method of claim 12, wherein x+y+z=1 with z<0.5 in the first layer and x+y+z=1 with x>0.3 and y>0.3 in the second layer.

20. The method of claim 12, wherein the third layer is deposited so as to have a grain size of 0.5 to 2 µm.

21. The method of claim 17, wherein the fourth layer has a thickness of 0.1 to 1 µm.

22. The method of claim 15, wherein the surface zone has a thickness of 15 to 35 µm.

23. A method of machining a workpiece with a turning insert comprising a cemented carbide body having a coating thereon, the cemented carbide body including WC, 5–11 wt % Co and 2–10 wt % cubic carbides of groups IVb, Vb and/or VIb of the periodic table and a highly W-alloyed binder phase with a CW-ratio of 0.76–0.92, the coating including a first layer of $TiC_xN_yO_z$ having a thickness of 0.1–2 µm and equiaxed grains <0.5 µm in size, a second layer of $TiC_xN_yO_z$ having a thickness of 3–15 µm and columnar grains <5 µm in diameter, and a third layer of smooth, fine-grained $\kappa$-$Al_2O_3$ having a thickness of 1–9 µm, the method comprising contacting the workpiece with a cutting edge of the insert, moving the insert relative to the workpiece and cutting material from the workpiece in contact with the cutting edge.

24. The method of claim 23, wherein the workpiece comprises hot or cold forged low alloyed steel.

25. The method of claim 23, wherein the workpiece comprises stainless steel.

26. The method of claim 23, wherein the workpiece comprises a gear ring, axle, bar, tube or flange.

27. A cutting tool insert for turning of steel comprising a cemented carbide body and a coating thereon, the cemented carbide body including WC, 6.5–8 wt % Co and 2–10 wt % cubic carbides of groups IVb, Vb and/or VIb of the periodic table and a highly W-alloyed binder phase with a CW-ratio of 0.8–0.9, the coating comprising:

a first layer of $TiC_xN_yO_z$ having a thickness of 0.1–2 µm and equiaxed grains <0.5 µm in size;

a second layer of $TiC_xN_yO_z$ having a thickness of 3–15 µm and columnar grains <5 µm in diameter;

a third layer of a smooth, fine-grained $\kappa$-$Al_2O_3$-layer having a thickness of 1–9 µm; and the cemented carbide body having a surface zone depleted of cubic carbides.

28. The cutting insert according to claim 27, wherein x+y+z=1 with z<0.5 in the first layer and x+y+z=1 with x>0.3 and y>0.3 in the second layer.

* * * * *

UNITED STATES PATENT AND TRADEMARK OFFICE
CERTIFICATE OF CORRECTION

PATENT NO. : 5,786,069
DATED : July 28, 1998
INVENTOR(S) : Bjorn Ljungberg et al.

It is certified that error appears in the above-identified patent and that said Letters Patent is hereby corrected as shown below:

Column 3,
Line 18, "CW-ratio =$M_s$ /(wt % Co)×(0.0161)" should read -- CW-ratio = $M_s$ / [(wt % Co)×(0.0161)] --.

Signed and Sealed this

Thirtieth Day of May, 2006

JON W. DUDAS
*Director of the United States Patent and Trademark Office*